United States Patent [19]

Yoshii et al.

[11] Patent Number: 5,543,334
[45] Date of Patent: Aug. 6, 1996

[54] METHOD OF SCREENING SEMICONDUCTOR DEVICE

[75] Inventors: Ichiro Yoshii, Kawasaki; Hiroyuki Kamijoh, Sagamihara; Yoshio Ozawa; Kikuo Yamabe, both of Yokohama; Kazuhiko Hashimoto, Meguro-Ku, all of Japan; Katsuya Okumura, Poughkeepsie, N.Y.; Kaoru Hama, Yokohama, Japan

[73] Assignee: Kabushiki Kaisha Toshiba, Tokyo, Japan

[21] Appl. No.: 356,419

[22] Filed: Dec. 15, 1994

[30] Foreign Application Priority Data

Dec. 15, 1993 [JP] Japan .................................. 5-315336

[51] Int. Cl.$^6$ .................................................. H01L 21/66
[52] U.S. Cl. .................................................. 437/8; 324/769
[58] Field of Search .......................... 437/8, 170, 173; 324/501, 522, 769

[56] References Cited

U.S. PATENT DOCUMENTS

| | | | |
|---|---|---|---|
| 4,296,372 | 10/1981 | Feuerbaum | 437/8 |
| 4,398,343 | 8/1983 | Yamazaki | 437/172 |
| 4,473,795 | 9/1984 | Wood | 324/54 |
| 4,598,305 | 7/1986 | Chiang et al. | 357/24 |
| 4,760,032 | 7/1988 | Turner | 437/8 |
| 5,391,502 | 2/1995 | Wei | 437/8 |
| 5,442,302 | 8/1995 | Fujimaki | 324/769 |
| 5,444,000 | 8/1995 | Ohkubo et al. | 437/8 |

FOREIGN PATENT DOCUMENTS

| | | | |
|---|---|---|---|
| 58-155732 | 9/1983 | Japan | 437/8 |
| 4-18743 | 1/1992 | Japan | 437/8 |
| 6-151544 | 5/1994 | Japan | 437/8 |

*Primary Examiner*—George Fourson
*Assistant Examiner*—S. Mulpuri
*Attorney, Agent, or Firm*—Loeb & Loeb LLP

[57] ABSTRACT

A method of screening a semiconductor device. A silicon wafer having gate electrodes formed on the gate oxide film is prepared. An insulating layer is deposited on the silicon wafer. Gate electrode portions of a group of transistors to be tested are exposed. A conductive layer is deposited on the silicon wafer having exposed gate electrodes. The conductive layer is patterned to be a wiring layer so that the gate electrodes of a group of the transistors can be electrically connected to each other. The chip area to be tested is irradiated with light having intensity enough to generate a required quantity of carriers in a depletion layer between a well and a substrate. A predetermined test voltage is applied between the wiring layer and the substrate of the silicon wafer during irradiation of the light to measure current flowing through the wiring layer and the gate oxide film. An abnormality of the gate oxide film can be detected on the basis of the measured current value. The screening method may be conducted before the completion of forming the gate electrodes. Further, gate electrode portions not to be used by a user may not be electrically connected to the gate electrode portions to be used.

15 Claims, 5 Drawing Sheets

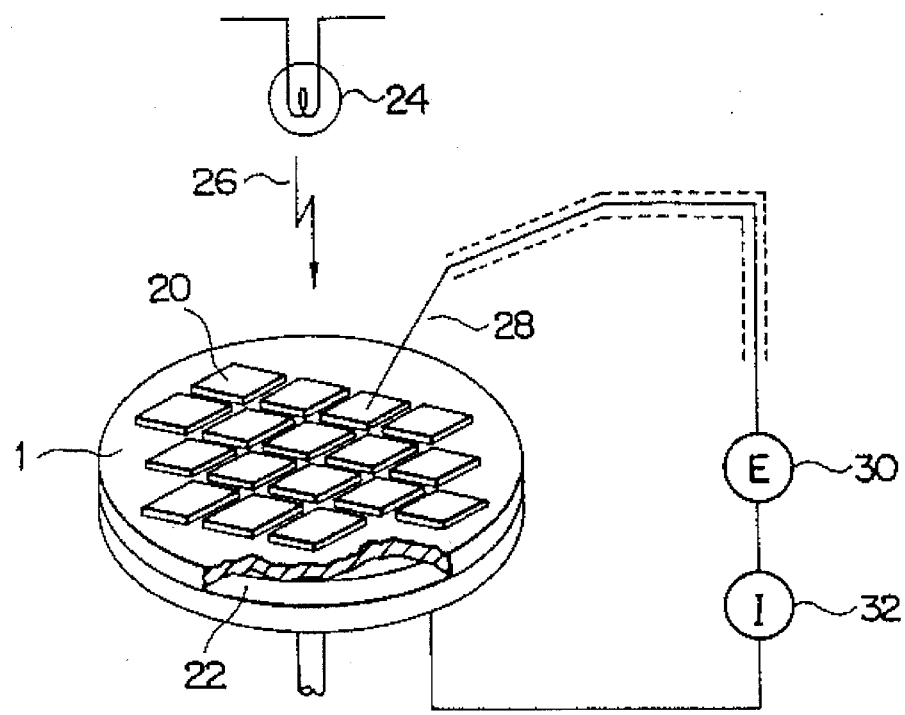
F I G. 5
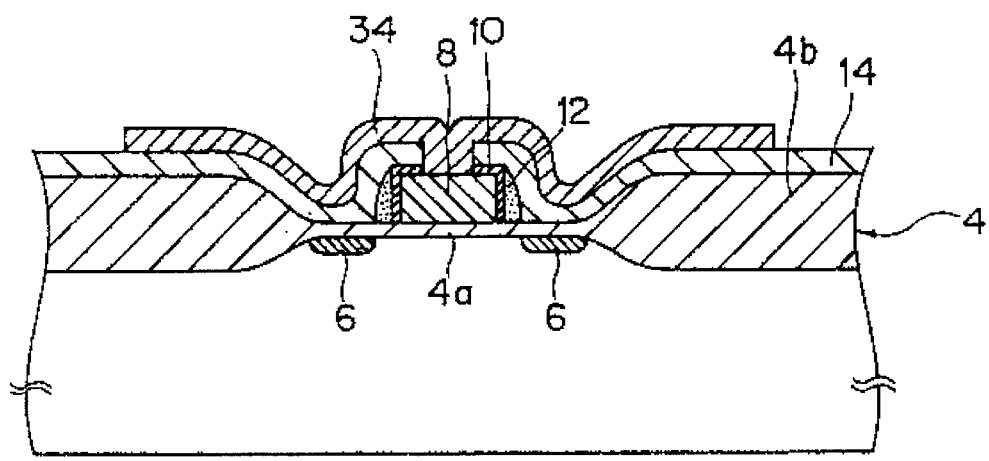
F I G. 6

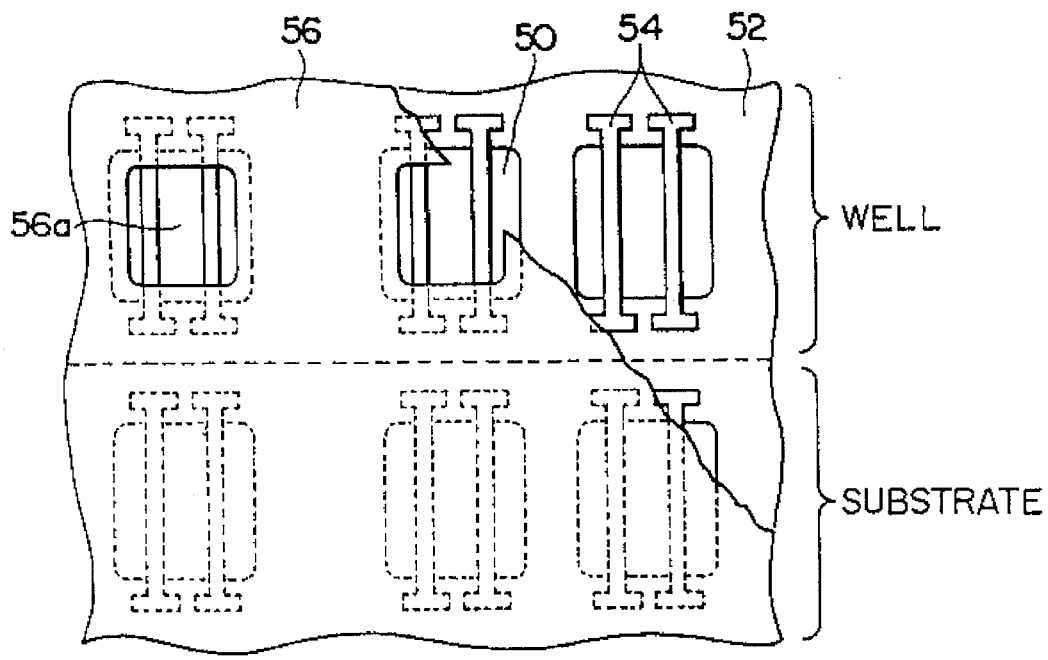
F I G. 9
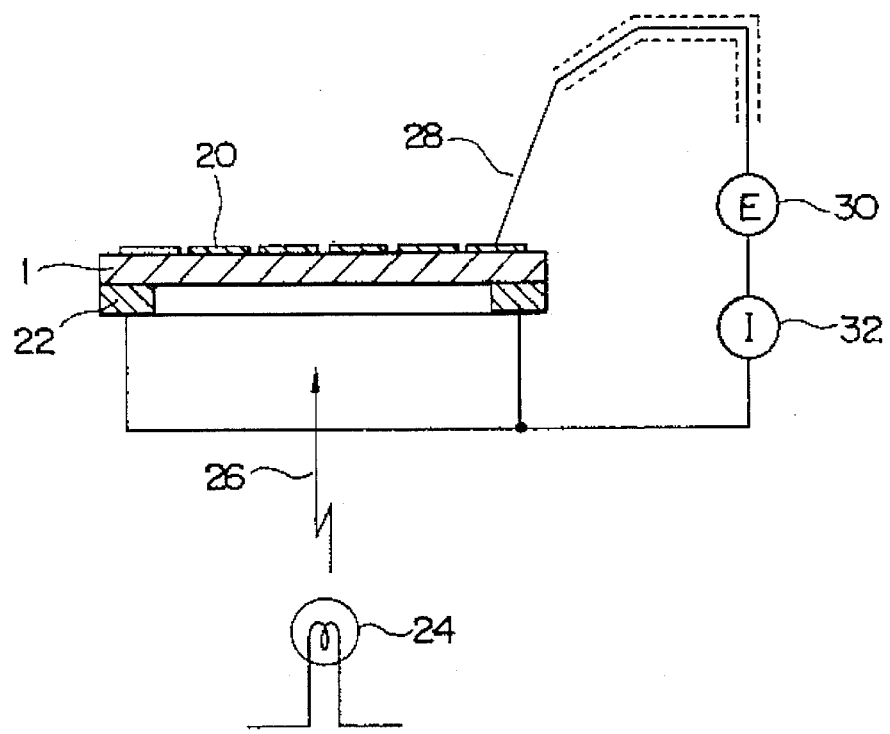
F I G. 10

METHOD OF SCREENING SEMICONDUCTOR DEVICE

BACKGROUND OF THE INVENTION

1. Field of the Invention

The present invention relates to a method of screening semiconductor devices in order to improve the product reliability in the process of manufacturing semiconductor devices such as MOS LSI circuits, in particular.

2. Description of the Prior Art

In the MOD LSI circuits, the products easy to be broken down tend to be defective in a short service time, thus causing a serious problem in the reliability of the MOS circuits. To overcome this problem, the MOS LSI products are usually screened before shipment from the factory. In the screening, a voltage higher than the voltage applied in use is applied to MOS LSI products assembled into a package for acceleration test, in order to previously remove the samples easy to be broken down.

An example of the prior art screening method is disclosed in Japanese Published Unexamined (Kokai) Patent Application No. 64-7633. In this prior art screening method, a wafer is prepared on which polycrystal gate electrodes are formed on gate oxide films for a group of transistors arranged on the same chip area; after an insulating layer has been deposited on this wafer, the deposited insulating layer is patterned to expose gate electrode portions; after that a metallic layer has been deposited on the exposed portions, a metallic layer is patterned so that only gate electrode portions of a group of transistors to be tested can be covered simultaneously; a voltage is applied between the metallic layer and the wafer to pass current through the respective gate oxide film at the same time; and when an abnormally large current flows, the gate oxide film is determined to be abnormal.

In the above-mentioned prior art screening method, however, since the gate electrodes of a group of transistors formed on the same chip are connected to each other by a patterned metallic layer, in the case where P-channel MOS transistors and N-channel MOS transistors are both included in the same LSI circuits, it has been difficult to detect the defective elements.

In more detail, in the semiconductor devices of this type, since any of the P-channel MOS transistors and the N-channel MOS transistors, e.g., P-channel MOS transistors are formed in wells, when the voltage is applied on the basis of the N-channel MOS transistors, a voltage drop at the PN junction between the well and the substrate is relatively large, so that a sufficient high screening voltage cannot be applied to the gate oxide film of the P-channel MOS transistors, with the result that it has been difficult to detect the abnormality at the gate oxide film within the well.

Further, when the screening voltage is applied, in spite of the fact that there exists a problem in that the gate oxide film deteriorates or the lifetime of the gate oxide film is shortened, nothing has been taken into account of this problem.

SUMMARY OF THE INVENTION

With these problems in mind, therefore, it is the object of the present invention to provide a method of screening semiconductor devices, which can test the gate oxide film of a group of transistors at the same time even where P-channel MOS transistors and N-channel MOS transistors are both formed in the same chip area simultaneously.

Another object of the present invention is to provide the method of screening semiconductor devices, which can avoid the problem in that the gate oxide film deteriorates or the lifetime of the gate oxide film is shortened.

To achieve the above-mentioned object, the present invention provides a method of screening a semiconductor device by testing gate oxide film of a group of transistors formed on a same chip area at the same time in process of manufacturing an integrated circuit including a plurality of MOS transistors having gate electrodes formed on the gate oxide film, which comprises the steps of: preparing a silicon wafer having gate electrodes formed on the gate oxide film; depositing an insulating layer on the silicon wafer; exposing the gate electrode portions of a group of the transistors to be tested; depositing a conductive layer on the silicon wafer having exposed gate electrodes; forming a wiring layer by patterning the conductive layer so that the gate electrodes of a group of the transistors can be electrically connected to each other; irradiating the chip area to be tested with light having intensity enough to generate a required quantity of carriers in a depletion layer formed between a well and a substrate of the silicon wafer; applying a predetermined test voltage between the wiring layer and the substrate of the silicon wafer during irradiation of the light; measuring current flowing through the wiring layer and the gate oxide film; and detecting an abnormality of the gate oxide film on the basis of the measured current value.

Further, the conductive layer is any one of Ti, TiN, polysilicon, a multi-layer film of Ti and a multi-layer film of Ti and TiN. Further, when the wiring layer is formed of a material of light shading characteristics, no wiring layer portion is formed in an active area of the transistor, and a surface of the silicon wafer is irradiated with the light. Further, the wavelength of the irradiated light ranges from 600 to 1200 nm. Further, when the wiring layer is formed of a material of light shading characteristics, a reverse surface of the silicon wafer is irradiated with the light. Further, the light shading material is any of carbon and silicide. Further, at least the chip of normal gate oxide film is heat treated at a temperature for restoring a drop of tolerance due to test voltage application for a predetermined time or more. Further, the temperature and time for the heat treatment are determined such an extent that the insulating layer and the gate oxide film are formed.

Further, the present invention provides a method of screening a semiconductor device by testing gate oxide film of a group of transistors formed on a same chip area at the same time in process of manufacturing an integrated circuit including a plurality of MOS transistors having gate electrodes formed on the gate oxide film, which comprises the steps of: preparing a silicon wafer having gate electrodes formed on the gate oxide film; depositing a conductive layer on the silicon wafer; patterning the conductive layer so that the gate electrodes of a group of the transistors can be formed and further these formed gate electrodes can be electrically connected to each other; irradiating the chip area to be tested with light having intensity enough to generate a required quantity of carriers in a depletion layer formed between a well and a substrate of the silicon wafer; applying a predetermined test voltage between the wiring layer and the substrate of the silicon wafer during irradiation of the light; measuring current flowing through the wiring layer and the gate oxide film; and detecting an abnormality of the gate oxide film on the basis of the measured current value.

Further, the present invention provides a method of screening a semiconductor device by testing gate oxide film of a group of transistors formed on a same chip area at the same time in process of manufacturing an integrated circuit including a plurality of MOS transistors having gate electrodes formed on the gate oxide film, which comprises the steps of: preparing a silicon wafer having gate electrodes formed on the gate oxide film; depositing a conductive layer on the silicon wafer; forming a nonconductive layer area at a position corresponding to an active area of the transistor formed at least in a well of the silicon wafer; irradiating the chip area to be tested with light having intensity enough to generate a required quantity of carriers in a depletion layer formed between a well and a substrate of the silicon wafer; applying a predetermined test voltage between the wiring layer and the substrate of the silicon wafer during irradiation of the light; measuring current flowing through the wiring layer and the gate oxide film; and detecting an abnormality of the gate oxide film on the basis of the measured current value.

BRIEF DESCRIPTION OF THE DRAWINGS

FIG. 5 is an illustration for assistance in explaining the first embodiment;

FIG. 6 is a cross-sectional view showing a semiconductor device for assistance in explaining the first embodiment of the screening method according to the present invention;

FIG. 9 is a partial plane view showing a semiconductor device for assistance in explaining a third embodiment of the screening method according to the present invention; and FIG. 10 is an illustration for assistance in explaining a fourth embodiment of the screening method according to the present invention.

DETAILED DESCRIPTION OF THE EMBODIMENTS

A first embodiment of the screening method according to the present invention wall be described hereinbelow with reference to FIGS. 1 to 6, which are cross-sectional and perspective views showing only the essential process thereof.

Figure 1:
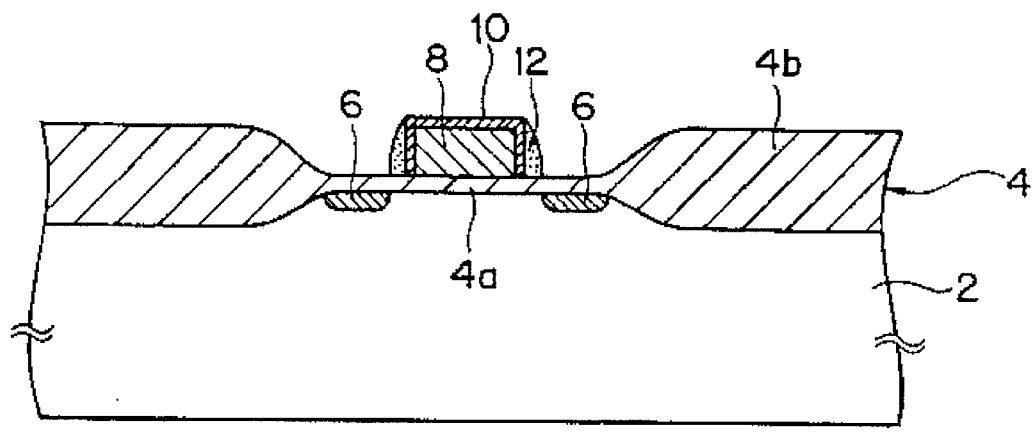
FIG. 1 is a cross-sectional view showing a semiconductor device for assistance in explaining a first embodiment of the screening method according to the present invention.

First, as shown in FIG. 1, a semiconductor device processed midway in accordance with the ordinary manufacturing process is prepared. Here, on a substrate 2 of a silicon wafer, an oxide silicon layer 4 is formed. This oxide silicon layer 4 is composed of a thinner gate oxide film portion (referred to as a gate oxide film, hereinafter) 4a and a thicker field oxide film portion (referred to as a field oxide film, hereinafter) 4b for dividing the substrate 2 into a plurality of non-continuous active areas. For each active area, at least one transistor can be formed. In FIG. 1, only a single transistor is formed at the active area. In the active area, a high concentration doped region, that is, a source/drain region 6 (when one is determined as a source, the other is determined as a drain) is formed. Further, a gate electrode 8 formed of polycrystal silicon is formed on the gate oxide film 4a, an oxide film 10 is deposited on the upper and side surfaces of the gate electrode 8, and a side wall oxide film 12 is formed on the side surface of the gate electrode 8.

Figure 2:
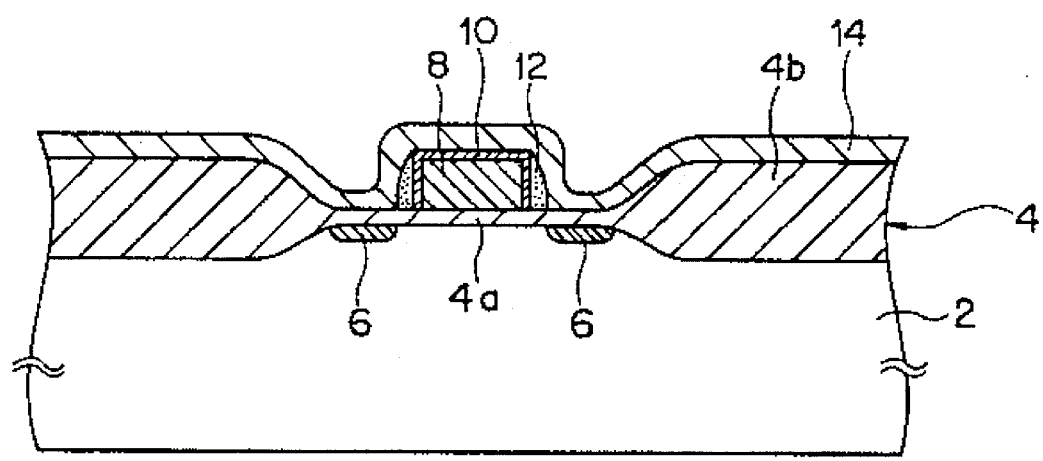
FIG. 2 is a cross-sectional view showing a semiconductor device for assistance in explaining the first embodiment.

Next, as shown in FIG. 2, on the semiconductor device processed midway, an oxide silicon layer 14 is deposited in accordance with CVD (chemical vapor deposition) method, for instance. When the thickness of this layer is too thin, there exists a possibility that wire is shorted to the substrate at the acceleration test conducted later; other hand, when the thickness of this layer is too thick, there exists a possibility that the non-defectiveness rate (i.e., yield) is lowered after the wire has been formed. Therefore, the film thickness of this oxide silicon layer 14 is determined from 50 to 400 nm.

Figure 3:
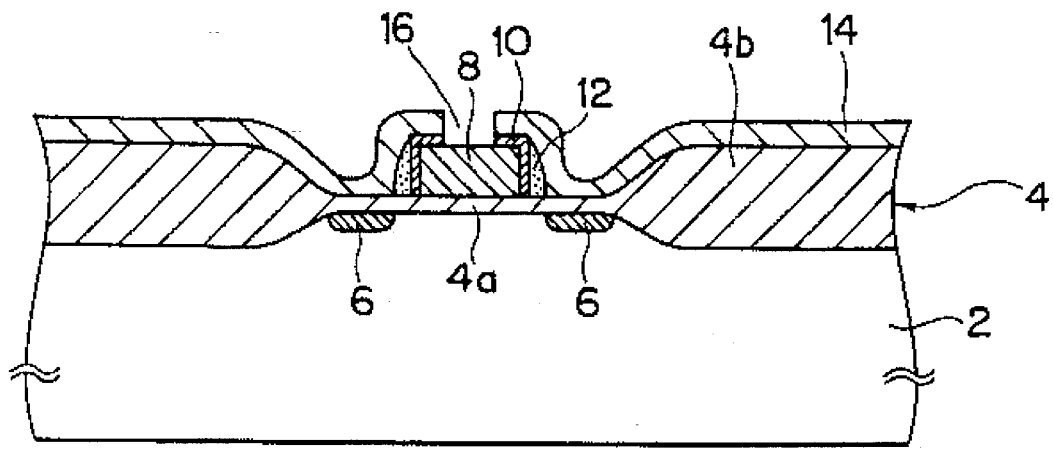
FIG. 3 is a cross-sectional view showing a semiconductor device for assistance in explaining the first embodiment.

Further, as shown in FIG. 3, a contact opening 16 is formed so that each electrode 8 of the transistor to be tested can be exposed.

Figure 4:
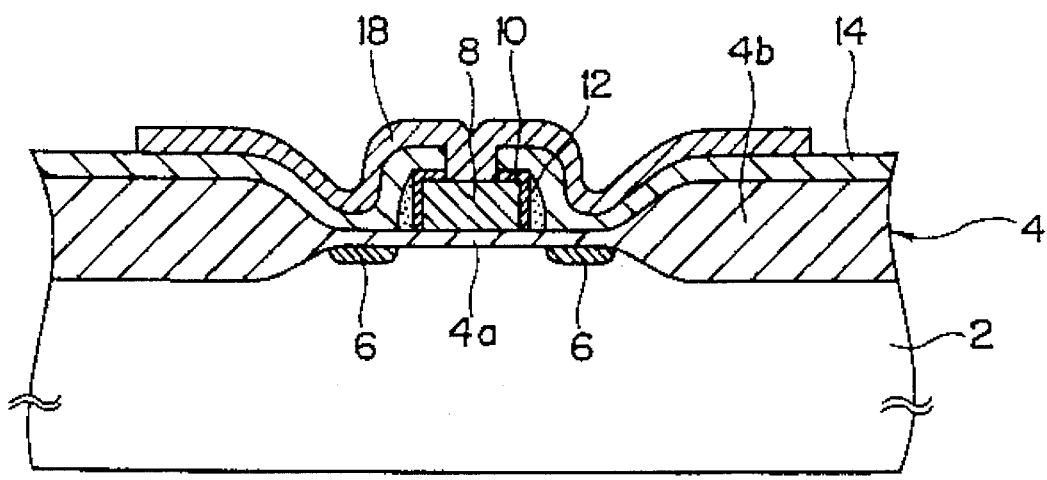
FIG. 4 is a cross-sectional view showing a semiconductor device for assistance in explaining the first embodiment.

Further, as shown in FIG. 4, a conductive layer is deposited all over the surface (including the oxide silicon film 14) of the device to such an extent that the contact opening 16 can be buried. After that, a test wiring layer 18 is formed by patterning in such a way that all the gate electrodes 8 of al the transistors to be tested on the same chip area can be connected to each other. The preferable wiring material is phosphorus-doped polysilicon or carbon under consideration of the peeling process conducted later. The sufficient sheet resistance is determined less than 1 M-ohm per square ($/mm_2$). Further, other materials can be used without causing any problems when the peeling process is taken into account appropriately. Further, when the phosphorus-doped polysilicon is used, it is appropriate to determine the film thickness between 30 and 200 nm.

Further, when metal is used as the wiring material, a multi-layer film of TiN or a multi-layer film composed of Ti and TiN is appropriate under consideration of the peeling process, and the film thickness is preferably about 50 to 300 nm.

Further, as shown in FIG. 5, a voltage for acceleration test is applied for a constant time for each chip area. In this case, a silicon wafer 1 from which a number of chips 20 can be cut off is mounted on a wafer stage 22, and further a light source 24 is disposed over the silicon wafer 1 to irradiate the surface of the silicon wafer 1 with radiation light 26. Further, a tip of a needle 28 is brought into contact with the test wiring layer 18 formed on the chip to apply the test voltage. The base end of the needle 28 is connected to a one terminal of a voltage source 30, and the other terminal of the voltage source 30 is connected to the wafer stage 22 via an ammeter 32.

Here, the applied voltage and the application time thereof for acceleration test are determined according to the film thickness of the gate oxide film 4a of the transistors. In this connection, when the test voltage is too low, the screening method is not effected reliably; and when too high, the chip may be broken down. Therefore, the appropriate test voltage is preferably 1.5 to 4 times higher than the ordinary operational supply voltage of the transistors. On the other hand, it is preferable to set the voltage application time as short as possible in the manufacturing process. However, if too short, the screening method is not reliable, so that the preferable time may be between 1 second and 1 minute in relation to the test voltage. For instance, in the case of an integrated circuit having a gate oxide film 4a with a thickness of about 20 nm, the voltage of 9 V is applied for about 5 sec.

By the way, where the chip to be tested is composed of only the N-channel MOS transistors or P-channel MOS transistors, since there exist no well, it is possible to apply the test voltage to the gate oxide film 4a of all the transistors formed in the same chip at the same time. On the other hand, where the N-channel MOS transistors and the P-channel MOS transistors are both formed in the same chip as with the case of CMOS transistors, since either one of the CMOS transistors is formed in a well, when the test voltage is applied on the basis of one of the CMOS transistors, a predetermined test voltage is not applied to the gate oxide film of the other of the CMOS transistors, because a reverse-direction voltage is applied between the well of one of the CMOS transistors and the substrate. The light source 24 shown in FIG. 5 is disposed to solve this problem. In more detail, when the chip is irradiated with the light 26, since a sufficiently large quantity of carriers can be generated in the depletion layer between the well and the substrate, it is possible to apply a sufficient test voltage to the gate oxide film of the transistor formed in the well.

After the acceleration test has been completed, an ordinary operational voltage or a voltage lower than that is applied to the gate oxide film of all the transistors formed in the same chip to be tested. Under these conditions, a leak current flowing therethrough at this time is measured with the ammeter 32 and further recorded as test data.

Further, although it is possible to obtain the leak current data by measuring the current flowing during the acceleration test, in this case it is preferable to measure current value obtained immediately before the acceleration test ends.

After that, the test wiring layer 18 already used for the acceleration test is removed in accordance with CDE (chemical dry etching) method, for instance to restore the device to the status as shown in FIG. 3.

Further, as shown in FIG. 6, an oxide silicon layer 34 is deposited as an insulating film, for instance in accordance with the CVD method to bury the once exposed contact opening 16. It is preferable to determine the thickness of this oxide silicon layer 34 thick, in order that impurities of borophosphosilicate glass (BPSG) deposited later might be prevented from reaching the gate oxide film 4a. However, there exists the case where thickness thereof must be determined smaller under consideration of the planarization of the interlayer film. Therefore, the appropriate thickness lies between 30 and 300 nm.

After that, although not shown, a BPSG is deposited to form a part of the interlayer film, and then the deposited BPSG is heat-treated for planarization. This heat treatment is indispensable in the screening method of the present invention in order to restore the tolerance (against breakdown voltage) of the gate oxide film 4a subjected to stress due to the acceleration test. Accordingly, a temperature and a period of time enough to form an oxide layer and a gate oxide film are necessary in this heat treatment process; that is, the preferable temperature and period of time are 600° C. or higher and 10 minute or longer. In practice, however, the device is kept at 850° C. for about 30 minute in order to planarize the interlayer film at the same time during the same process within an atmosphere of nitrogen gas, Argon inert gas, or a gas containing oxygen.

After that, the device is processed through the ordinary process of manufacturing semiconductor devices such as the formation of the contact openings, the spattering of the wire electrode material, the patterning of the electrodes, etc. and then assembled. Here, the semiconductor devices are tested in the operation test process, before assembled. In this operation test process, the leak current value recorded in the former acceleration test process is taken into account in combination with the general criterion of this operation test. In practice, the leak current threshold value in the acceleration test is set, and the chip (in which leek current flows exceeding this threshold value) is determined defective (as being out of the acceptable standard), in spite of the fact that the chip has been once determined non-defective in this operation test process. For instance, when the leak current of one transistor is determined 1 pA, the criterion of the total leak current value for an integrated circuit composed of one million transistors is 1 µA.

As described above, in the first embodiment of the screening method according to the present invention, even if the P-channel MOS transistors and the N-channel MOS transistors are both formed in the same chip area, it is possible to test the gate oxide film of a group of the transistors at the same time.

Further, since the chips determined as being normal in the acceleration test process for the gate oxide film are further heat treated, it is possible to prevent gate oxide film from being deteriorated or the lifetime of the gate oxide film from being shortened due to the application of the high screening voltage.

A second embodiment of the screening method according to the present invention will be described hereinbelow with reference FIGS. 7 and 8.

In the first embodiment, after the gate electrode has been formed and then the source/drain region has been also formed, the test voltage is applied to the gate oxide film. In this second embodiment, however, before the perfect gate electrode is formed, that is, before the gate electrode has been formed, a test voltage is applied to the gate oxide film for acceleration test and for measurement of the leak current.

Figure 7:
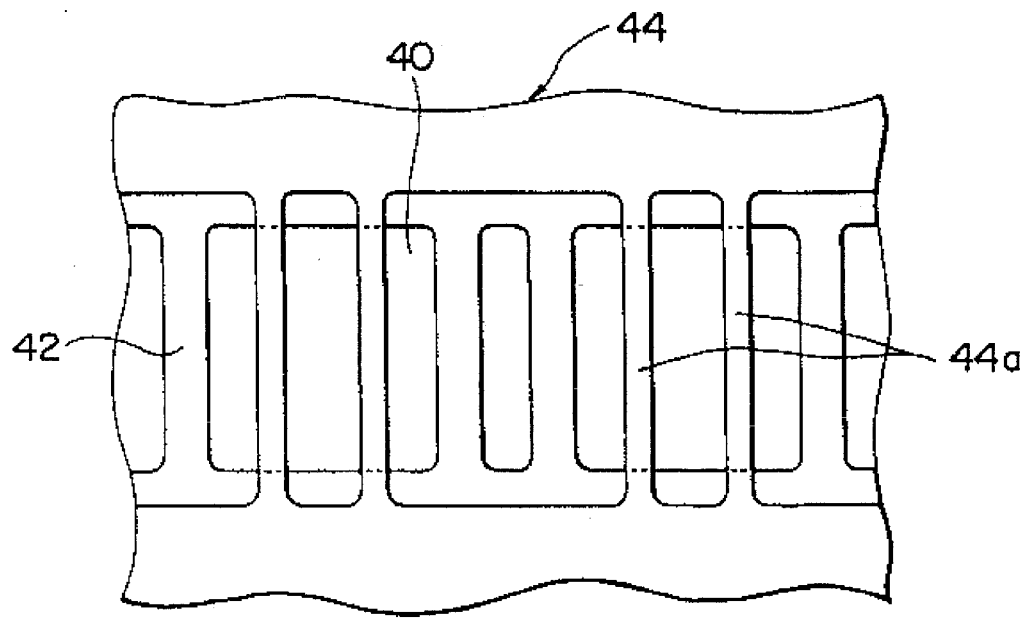
FIG. 7 is a partial plane view showing a semiconductor device for assistance in explaining a second embodiment of the screening method according to the present invention.
Figure 8:
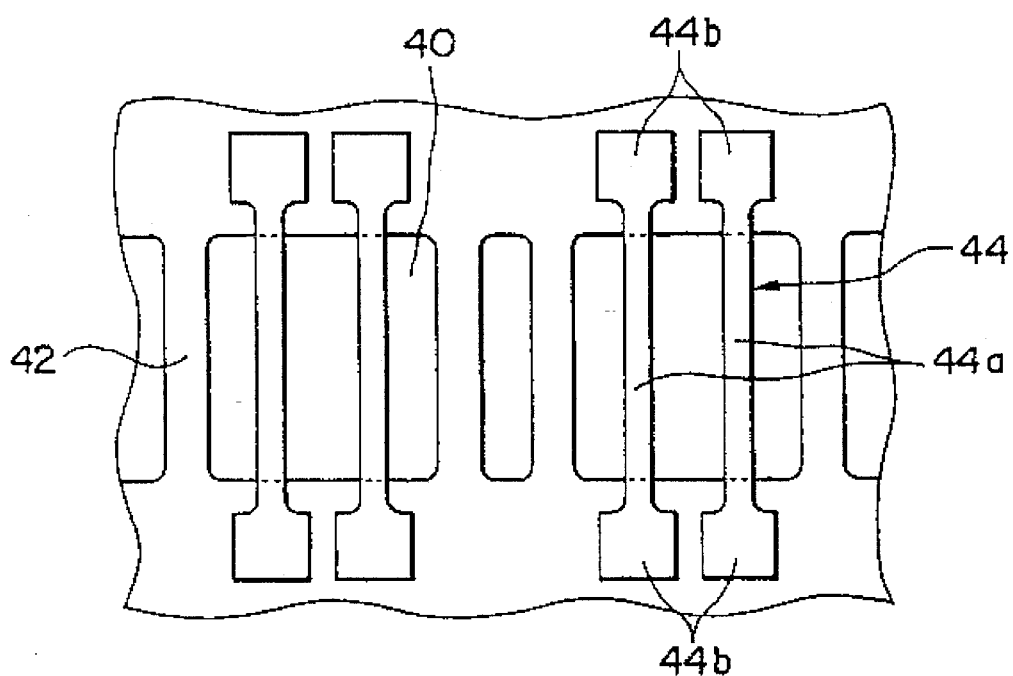
FIG. 8 is a partial plane views showing a semiconductor device for assistance in explaining the second embodiment.

FIGS. 7 and 8 show an, example in which two gate electrodes 44a are formed in an active area. First, as shown in FIG. 7, in the process of forming two gate electrodes 44a in an active area 40 enclosed by a field oxide film 42, the device is so patterned that belt-like wiring portions 44 can remain on both end portions of the two gate electrodes 44a. Further, by use of these belt-like wiring portions 44, the same acceleration test and leak current measurement as described in the first embodiment are effected. The same wiring material as described in the first embodiment is used for the wiring portions 44.

After that, as shown in FIG. 8, the belt-like wiring portion 44 is patterned to form contact portions 44b on both end portions of the gate electrodes 44a. After this, the same heat treatment as described in the first embodiment is conducted.

In comparison between the first and second embodiments, in this second embodiment, since the process of exposing the contact opening 16 (as shown in FIG. 3), the process of depositing the wiring polysilicon layer (test wiring layer) 18 (as shown in FIG. 4), and the process of removing the wiring polysilicon layer 18 (not shown) can be all eliminated, it is possible to shorten the manufacturing process.

In the first and second embodiments, any required carriers can be generated in the depletion layer by irradiating the surface of the wafer with light during screening test. In FIG. 7, even if the gate electrodes 44a are formed of a material of light shading characteristics, since the active area 40 can be irradiated with the light, there exists no problem. However, when carbon, silicide, etc., of light shading characteristics is used instead of the oxide silicon layer 34 shown in FIG. 6, there arises a problem in that the carriers are not generated.

A third embodiment of the screening method according to the present invention for solving this problem will be described hereinbelow with reference to FIG. 9. In FIG. 9, in the upper half portion of the wafer, each transistor is formed in a well; and in the lower half portion of the wafer, each transistor is formed on the substrate. In both the transistors, after an oxide silicon layer 52 has been patterned so that each active area 50 can be exposed, gate electrodes 54 are formed by patterning the same oxide silicon layer 52. Here, the screening wiring layer 56 of light shading characteristics is deposited on the semiconductor device for screening. The same wiring material as described in the first embodiment is used for the wiring layer In the case of the first embodiment, the screening wiring layer 56 is patterned so that the test voltage is not applied to areas other than the predetermined areas. In this embodiment, however, no wiring areas 56a are formed so that the active areas of the transistors formed in the well can be irradiated with light of wavelength ranging from 600 to 1200 nm. Accordingly, light allowed to be incident upon the surface of the device can pass through the wells to the junction portion between the wells and the substrate portion, so that it is possible to generate carriers. In the third embodiment, the same heat treatment as described in the first embodiments is conducted.

In the screening method shown in FIG. 9, even when the same test voltage is applied to the respective gate oxide film of the P-channel MOS transistors and the N-channel MOS transistors, no problem arises in screening test. In this method, since a window can be opened at each active area of the screening wiring layer 56 by use of a simple pattern, it is possible to facilitate the design and manufacturing steps of the semiconductor device markedly.

Further, in the case of the gate array, the user himself determines which transistors are to be used or which transistors are not to be used among a great number of transistors arranged in a matrix pattern. In this case, when the screening wiring layer 56 is formed on the surfaces of the transistors not actually used, in spite of the fact that the device is non-defective (even if defective at the non-used areas, the device is non-defective at least at the actually used areas), the device is determined to be defective by the screening test. In this third embodiment, since no wiring areas 56a (not used by the user) can be formed at a part of the screening wiring layer 56, it is possible to overcome the above-mentioned problem at the same tame.

A fourth embodiment of the screening method according to the present invention will be described with reference to FIG. 10.

When considering the heat treatment process for restoring the tolerance (against breakdown voltage), it Is advantageous to use polysilicon or germanium as the screening wiring layer 56 without using the metallic materials. Therefore, when a material of light shading characteristics is used for the screening wiring layer 56 and further it is difficult to form non-wiring areas 56a as shown in FIG. 9, it is possible to solve this problem by arranging the light source 24 under the ring-shaped wafer 22, that is, by irradiating the reverse surface of the silicon wafer 1 with the light 26 as shown in FIG. 10.

As described above, in the screening method according to the present invention, when the test voltage is applied to the chip area in order to measure abnormal leak current flowing through the gate oxide film, since the chip area is additionally irradiated with light, even if the P-channel MOS transistors and the N-channel MOS transistors are both formed in the same chip area, it is possible to test the gate oxide film of a group of the CMOS transistors simultaneously.

Further, the chips whose gate oxide film is determined to be normal are further heat-treated at a predetermined temperature for a predetermined tame, it is possible to prevent the gate oxide film from being deteriorated and the lifetime of the device from being shortened both due to the application of the screening voltage.

What is claimed is:

1. A method of screening a semiconductor device by testing gate oxide film of a group of transistors formed on a same chip area at the same time in process of manufacturing an integrated circuit including a plurality of MOS transistors having gate electrodes formed on the gate oxide film, which comprises the steps of:

preparing a silicon wafer having gate electrodes formed on the gate oxide film;

depositing an insulating layer on the silicon wafer;

exposing the gate electrode portions of a group of the transistors to be tested;

depositing a conductive layer on the silicon wafer having exposed gate electrodes;

forming a wiring layer by patterning the conductive layer so that the gate electrodes of a group of the transistors can be electrically connected to each other;

irradiating the chip area to be tested with light having intensity enough to generate a quantity of carriers in a depletion layer formed between a well and a substrate of the silicon wafer;

applying a test voltage between the wiring layer and the substrate of the silicon wafer during irradiation of the light;

measuring current flowing through the wiring layer and the gate oxide film while performing the irradiating step and applying the test voltage step; and detecting an abnormality of the gate oxide film on the basis of the measured current value.

2. The screening method of claim 1, wherein the conductive layer is any one of Ti, TiN, polysilicon, a multi-layer film of Ti end a multi-layer of Ti and TiN.

3. The screening method of claim 1, wherein when the wiring layer is formed of a material of light shading characteristics, no wiring layer portion is formed in an active area of the transistor, and a surface of the silicon wafer is irradiated with the light.

4. The screening method of claim 3, wherein wavelength of the irradiated light ranges from 600 to 1200 nm.

5. The screening method of claim 1, wherein when the wiring layer is formed of a material of light shading characteristics, a reverse surface of the silicon wafer is irradiated with the light.

6. The screening method of claim 5, wherein the light shading material is any of carbon and silicide.

7. The screening method of claim 1, wherein at least the chip of normal gate oxide film is heat treated at a temperature for restoring a drop of tolerance due to test voltage application for a time period.

8. The screening method of claim 7, wherein the temperature and time are determined such an extent that the insulating layer and the gate oxide film are formed.

9. A method of screening a semiconductor device by testing gate oxide film of a group of transistors formed on a same chip area at the same time in process of manufacturing an integrated circuit including a plurality of MOS transistors having gate electrodes formed on the gate oxide film, which comprises the steps of:

preparing a silicon wafer having gate electrodes formed on the gate oxide film;

depositing a conductive layer on the silicon wafer;

forming a wiring layer by patterning the conductive layer so that the gate electrodes of a group of the transistors can be formed and further these formed gate electrodes can be electrically connected to each other;

irradiating the chip area to be tested with light having intensity enough to generate a quantity of carriers in a depletion layer formed between a well and a substrate of the silicon wafer;

applying a test voltage between the wiring layer and the substrate of the silicon wafer during irradiation of the light;

measuring current flowing through the wiring layer and the gate oxide film while performing the irradiating step and applying the test voltage step; and detecting an abnormality of the gate oxide film on the basis of the measured current value.

10. The screening method of claim 9, wherein the conductive layer is any one of Ti, TiN, polysilicon, a multi-layer film of Ti and a multi-layer film of Ti and TiN.

11. The screening method of claim 9, wherein the wiring layer is formed outside transistor active areas.

12. The screening method of claim 9, wherein at least the chip of normal gate oxide film is heat treated at a temperature for restoring a drop of tolerance due to test voltage application for a time period.

13. A method of screening a semiconductor device by testing gate oxide film of a group of transistors formed on a same chip area at the same time in process of manufacturing an integrated circuit including a plurality of MOS transistors having gate electrodes formed on the gate oxide film, which comprises the steps of:

preparing a silicon wafer having gate electrodes formed on the gate oxide film;

depositing a conductive layer on the silicon wafer, said conductive layer serving as a wiring layer to electrically couple the gate electrodes of the plurality of transistors;

forming a nonconductive layer area at a position corresponding to an active area of the transistor formed at least in a well of the silicon wafer;

irradiating the chip area to be tested with light having intensity enough to generate a quantity of carriers an a depletion layer formed between a well and a substrate of the silicon wafer;

applying a test voltage between the wiring layer end the substrate of the silicon wafer during irradiation of the light;

measuring current flowing through the wiring layer and the gate oxide film while performing the irradiating step and applying the test voltage step; and detecting an abnormality of the gate oxide film on the basis of the measured current value.

14. The screening method of claim 13, wherein at least the chip of normal gate oxide film is heat treated at a temperature for restoring a drop of tolerance due to test voltage application for a time period.

15. The screening method of claim 13, wherein the conductive layer is any one of Ti, TiN, polysilicon, a multi-layer film of Ti and a multi-layer film of Ti and TiN.

* * * * *